United States Patent [19]

Scaman

[11] Patent Number: 5,818,239

[45] Date of Patent: Oct. 6, 1998

[54] SIMPLIFIED CONTACTLESS TEST OF MCM THIN FILM I/O NETS USING A PLASMA

[75] Inventor: Michael E. Scaman, Peekskill, N.Y.

[73] Assignee: International Business Machines Corporation, Armonk, N.Y.

[21] Appl. No.: 811,988

[22] Filed: Mar. 5, 1997

[51] Int. Cl.$^6$ .................................................. G01R 31/02
[52] U.S. Cl. ..................... 324/537; 324/514; 324/750; 324/752; 324/501
[58] Field of Search ........................ 324/500, 501, 324/514, 537, 750, 752, 754, 73, 158.1, 459

[56] References Cited

U.S. PATENT DOCUMENTS

| | | | |
|---|---|---|---|
| 4,507,605 | 3/1985 | Geisel | 324/536 |
| 4,600,878 | 7/1986 | Doemens et al. | 324/514 |
| 4,764,719 | 8/1988 | Zeh | 324/459 |
| 4,771,230 | 9/1988 | Zeh | 324/459 |
| 4,812,756 | 3/1989 | Curtis et al. | 324/750 |
| 4,829,238 | 5/1989 | Goulette et al. | 324/95 |
| 4,891,578 | 1/1990 | Doemens | 324/73.1 |
| 4,967,149 | 10/1990 | Doemens et al. | 324/514 |
| 4,970,461 | 11/1990 | LePage | 324/752 |
| 5,006,788 | 4/1991 | Goulette et al. | 324/95 |
| 5,032,788 | 7/1991 | Ringleb et al. | 324/752 |
| 5,039,938 | 8/1991 | Kohnen et al. | 324/750 |
| 5,202,623 | 4/1993 | LePage | 324/758 |
| 5,404,110 | 4/1995 | Golladay | 324/751 |
| 5,498,974 | 3/1996 | Verkuil et al. | 324/767 |
| 5,680,056 | 10/1997 | Ito et al. | 324/750 |

OTHER PUBLICATIONS

T. Bayer, et al., "Open/Short Testing", IBM Technical Disclosure Bulletin, vol. 27, No. 4A Sep. 1984, pp. 2024–2025.
"Electro–Optic Sampling for Multi–Layer Ceramic Test," IBM Technical Disclosure Bulletin, vol. 38, No. 05, May 1995, pp. 117–179.

*Primary Examiner*—Diep N. Do
*Attorney, Agent, or Firm*—Whitham, Curtis & Whitham; H. Daniel Schnurmann

[57] ABSTRACT

A gas panel plasma plate is used to detect shorts and opens on a thin film surface of a multilayer ceramic module (MCM) through biasing a circuit of the module through bottom surface module (BSM) pins to produce a glow within the plasma plate. A grounded plane is placed above the module to be tested, and the gap between the module and the plane is filled with a gas. A plasma discharge is created by biasing the circuit. The current produced at the BSM pin by the plasma discharge is monitored. The monitored current of the circuit under test is compared to a current range of a known good module. In the alternative, the light flux produced by the plasma discharge is monitored, and the monitored light flux is compared to a light flux range of a known good module.

10 Claims, 7 Drawing Sheets

SIMPLIFIED CONTACTLESS TEST OF MCM THIN FILM I/O NETS USING A PLASMA

BACKGROUND OF THE INVENTION

1. Field of the Invention

The present invention generally relates to testing electronic circuits and, more particularly, to a contactless method and apparatus for testing for opens and shorts in thin film networks connected to a bottom surface metallurgy (BSM) input/output (I/O) pad on a multi-chip module (MCM) containing electrical thin film wiring nets or laser vias under test.

2. Background Description

During the manufacture of the thin film layers of MCM substrates, it may not be possible to utilize contact test methods until all top surface metallurgy (TSM) thin film layers of a substrate are completed. For yield reasons, it may be desirable to locate shorts and opens on nets as each thin film layer is made and repair them where possible.

General shorts and opens may be detected by optical inspection techniques with some success and some amount of escapes. MCM substrates may tolerate some level of shorts and opens as many substrates are made with the possibility of adding or deleting wiring after the part is completed or almost completed. Automatic optical inspection (AOI) may be costly or may not always be effective and sometimes test methods are more reliable.

Not all shorts or opens are equally serious due to many MCM substrates being designed for repairability. In general, if a short or open occurs on a net connected to a BSM I/O pad, it would be more serious and likely a fatal defect as it would not be possible to wire around or delete it. It is therefore desirable for yield reasons to find and locate shorts and opens on thin film nets connected to BSM I/O pads with special care and as effectively as possible.

Capacitive methods have had some success for some products where a capacitive plate is placed over the part and the capacitance at each BSM I/O pad is measured and compared to a learned value. A higher or lower capacitance reading may indicate a short or open respectively using such a test. One drawback to such a test is that the capacitance will be influenced by the brick line together with the thin film pattern under test. If the brick line is very long, the percentage of the capacitance due to the thin film portion of the net may be small and it may not be practical or possible to efficiently find opens in the thin film net under test, so the capacitance approach may be effective for shorts but for very complex products may not always be as effective for opens.

Another class of fatal opens would be those which occur in the laser vias between metalization layers and, as before, if a laser via on a BSM I/O net was too small or clogged, it may be a fatal defect. A capacitive approach would be no help in testing laser vias on BSM I/O nets. Optical approaches to laser via inspection may be problematic due to the exceedingly small size of laser vias, the variability of the appearance of the surface of the metal at the bottom of the via and the need to catch small amounts of residual polyimide at the bottom of the via. In the case of laser via inspection, it may be less possible to repair a bad laser via, but it would be valuable for process diagnostics and yield learning to locate defective laser vias.

In some cases, it may not be possible to directly contact the BSM pads of an MCM substrate since for some products, the BSM is sealed in polyimide to prevent or minimize a variety of manufacturing problems and capacitive tests which require direct contact with a BSM pad may not be possible.

Some have applied plasma techniques to inspection which also offer a noncontact test to the most general classes of TSM shorts and opens. These approaches tend to drive mechanical, optical complexity and may require image processing.

SUMMARY OF THE INVENTION

It is therefore an object of the present invention to provide a simplified contactless method and apparatus for testing for opens and shorts of a device under test containing thin film electrical circuit wiring patterns connected to a BSM I/O pad.

It is another object of the invention to test laser vias connected to a BSM I/O pad.

According to the invention, a gas panel plasma plate is used to detect shorts and opens on a thin film surface of an MCM through biasing a circuit through bottom surface metallurgy (BSM) pins to produce a glow within the plasma plate. A grounded plane is placed above the module to be tested, and the gap between the module and the plane is filled with a gas. A plasma discharge is created in the gas by biasing a circuit in the module. The current produced at the BSM pin by the plasma discharge is monitored. The monitored current of the circuit under test is compared to a current range of a known good module. In the alternative, the light flux produced by the plasma discharge is monitored, and the monitored light flux is compared to a light flux range of a known good module.

Some MCM processes require that the BSM pads be sealed in polyimide for many of the processing steps, making it impossible to directly ohmically contact each I/O or voltage plane pad, although it may be possible to make a small number of voltage plane pads specially dedicated to being ohmically probed by a pogo pin with special openings in the BSM polyimide around them for that purpose. With this type of process, all BSM I/O pads are sealed in polyimide and not accessible by resistive ohmic pogo pin type probing. In this case, capacitive probing can be used through the polyimide. An interposer is placed parallel and beneath the BSM. The interposer is insulating except that it includes a conductive cylinder under each BSM I/O pad. Each conductive cylinder has a radius matching or slightly less than the BSM I/O pads. Each conductive cylinder, with its matching BSM I/O pad, forms a parallel plate capacitor and, in the 1 to 20 MHZ range, can be used to capacitively test for the presence of shorts. In this case, rather than probing the MCM BSM directly, the interposer which is pressed close and parallel to the MCM BSM is probed.

These tests can be mechanically simplified to detect a voltage plane to BSM signal I/O short which is a very significant cause of poor yields for power mesh layers. With one optical or current measurement, these fixtures detect if a power to BSM I/O short is present on a part being fabricated. When ohmic contact with BSM I/O pads can be made with pogo pins, it is also possible to detect the location of voltage plane to BSM I/O shorts magnetically. The difficulty again is presented if the BSM I/Os are sealed in polyimide through most of the process. In that case, a capacitively coupled interposer is again used to make contact with the BSM I/O pads at a high frequency. In this case, the interposer is a solid conductive sheet with holes in registration with voltage and ground pads. These holes have a radius the same or slightly larger than the BSM voltage and ground pads. The conductive sheet with holes maximizes capacitive coupling to the BSM I/O pads while minimizing coupling to the voltage plane pads. As before, a few special pads are set aside for direct ohmic resistive contact probing of each voltage plane. These special pads are not sealed. In the case of testing power mesh layers for BSM I/O voltage shorts, the plasma induced current will be much lower if no I/O is shorted to the very large area voltage plane, so one measurement of the one induced current will detect the presence of any BSM I/O to voltage plane short of sufficiently low resistance. This test needs to occur at a high enough frequency to capacitively couple the plate to the BSM pads and needs to be in the 1 to 20 MHZ range.

Lastly, once a power to power or power to BSM I/O short is detected, a low frequency pulsed current is added to cause a blinking effect in the plasma to isolate where the short is on the TSM. The location of the short needs to be identified in order to try to save the part by laser repair. Since the current through the short will generally be in the horizontal plane and the moving charges are in vertical motion, the magnetic field will exert a force locally on the glow plasma causing a blinking effect which can be inspected to locate the short for eventual repair.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 6:
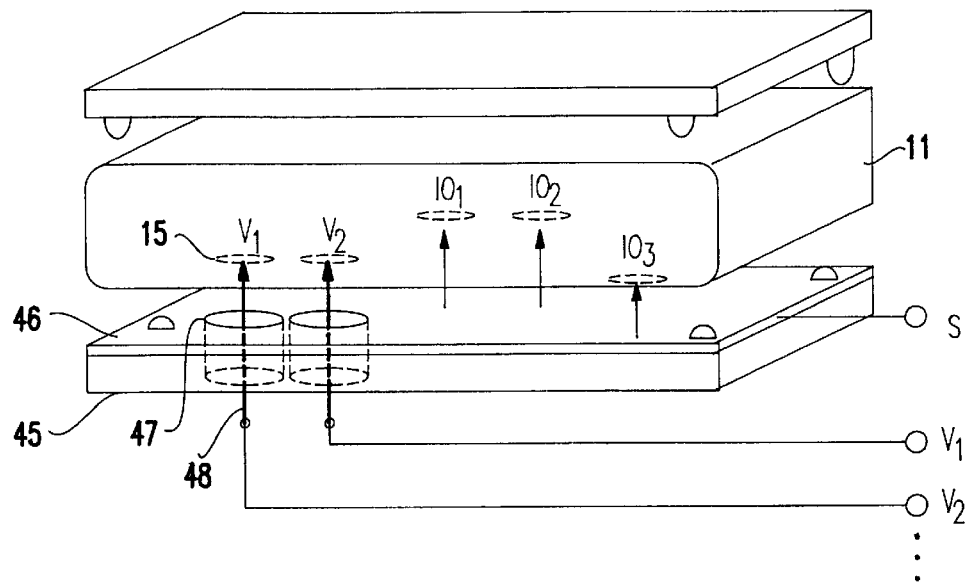
FIG. 6 is a pictorial view of an ohmic test fixture for BSM I/O to voltage plane shorts or voltage plane to voltage plane shorts.
Figure 7:
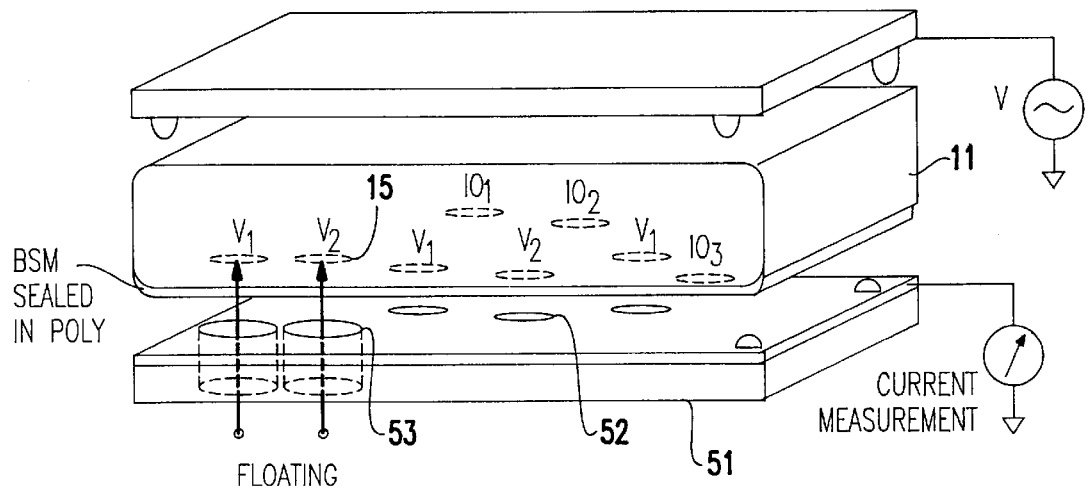
FIG. 7 is a pictorial view of a plasma in line test fixture for voltage plane to BSM I/O shorts.
Figure 8:
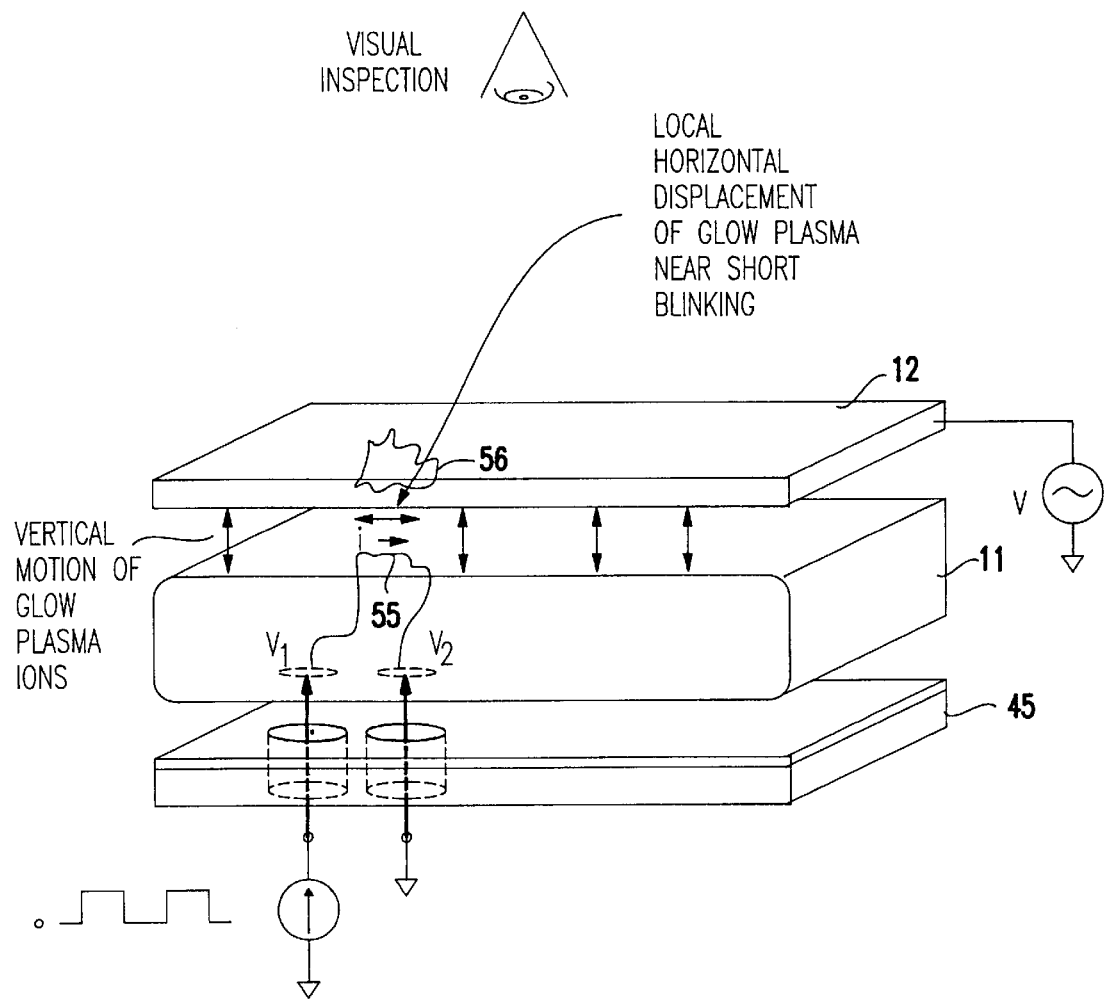
FIG. 8 is a pictorial view of a test fixture illustrating a method of visualizing a location of a voltage plane to voltage plane short using an AC glow plasma with a pulsed current through the short.
Figure 9:
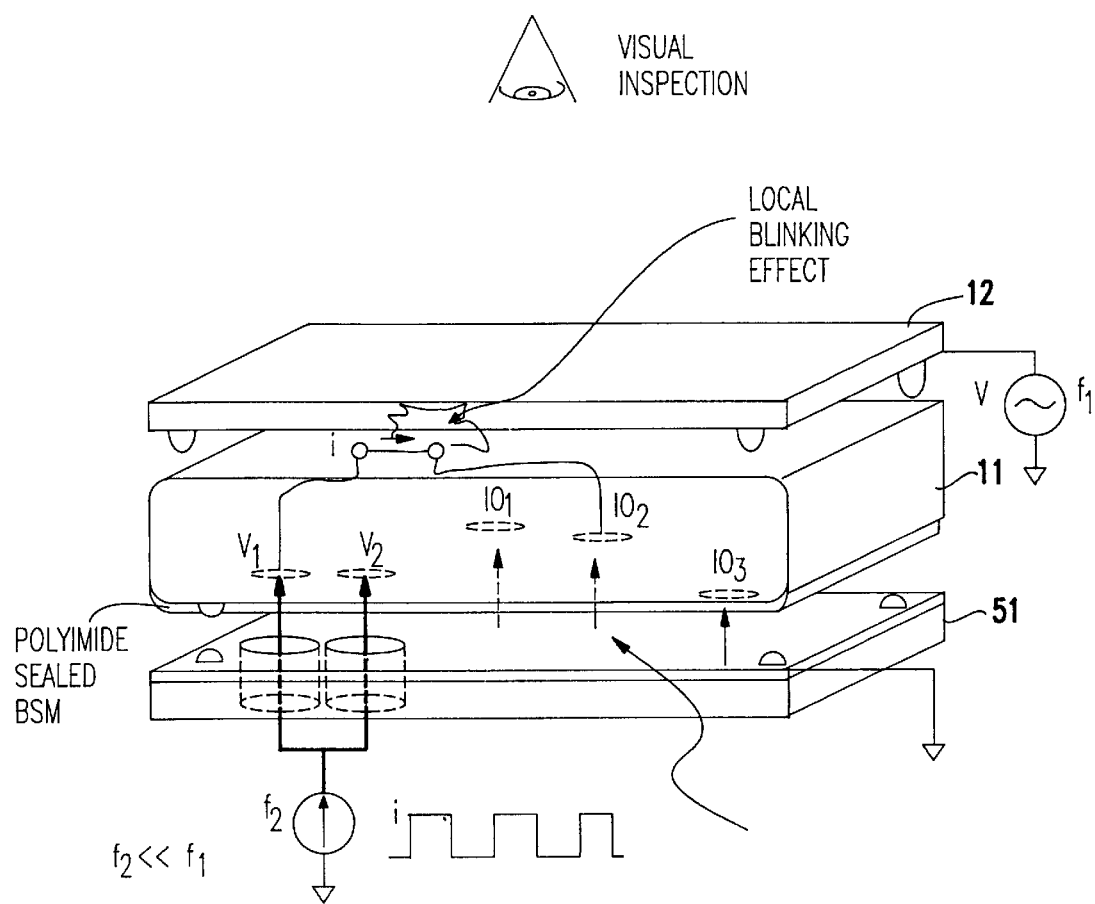
FIG. 9 is a pictorial view of a test fixture illustrating a method of visualizing a location of a BSM I/O to voltage plane short using an AC glow plasma while pumping a pulsed current through the short.
Figure 10:
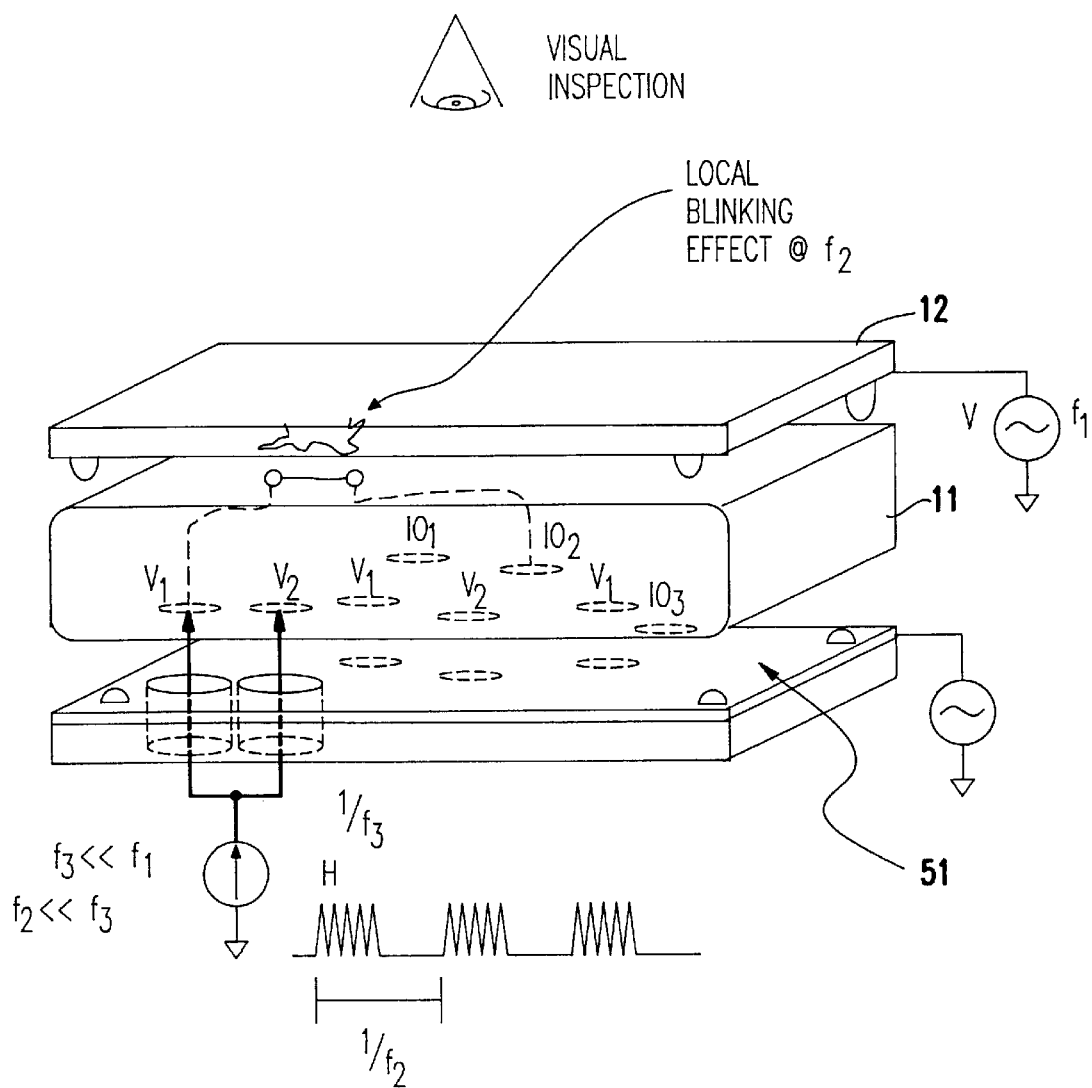
FIG. 10 is a pictorial view of a test fixture illustrating a method of visualizing a location of a BSM I/O to voltage plane short using an AC glow plasma while pumping a modulated plasma current through the short.

The invention is described in terms of three groups of methods that lead from one to the next in an ordered progression. The first group is illustrated by FIGS. 1 to 5 provides general in line test for opens and shorts for metalization layers and laser via layers. The second group, illustrated by FIGS. 6 and 7, provides for simplified shorts detection for power mesh layers. Finally, the third group provides for shorts location for parts known to have a short in a power mesh layer and is illustrated in FIGS. 8 to 10.

Figure 1:
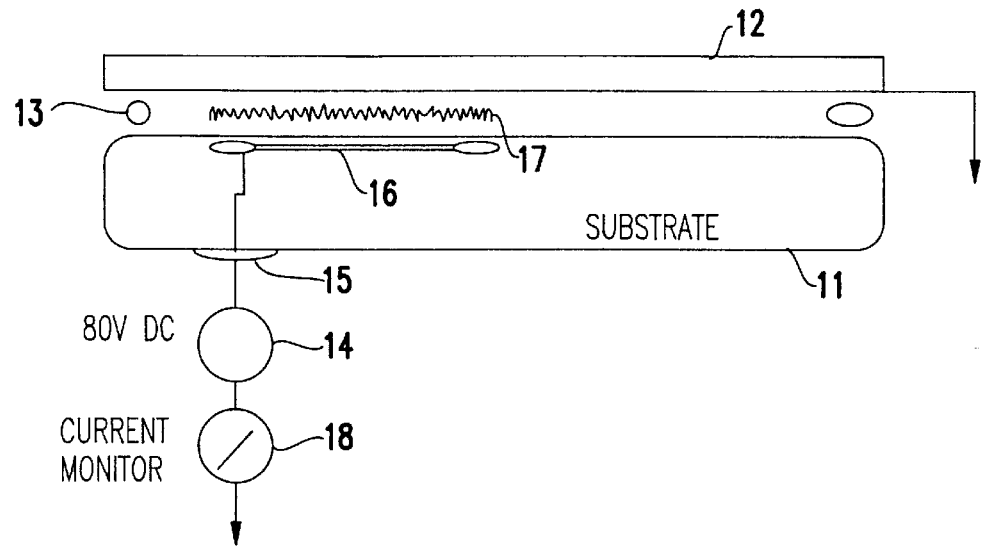
FIG. 1 is a functional block diagram showing the basic structure of the testing apparatus according to the preferred embodiment of the invention.

Referring now to the drawings, and more particularly to FIG. 1, there is shown a substrate 11, such as a multi-layer ceramic module (MCM), over which a quartz plate 12 has been placed. The quartz plate 12 is spaced apart from the substrate 11 by a spacer 13. The spacer 13 provides a seal between the quartz plate 12 and the substrate 11. The space between the substrate 11 and the quartz plate 12 is filled with a gas, such as neon or argon. The surface of the quartz plate 12 closest to the substrate has thin film of indium tin oxide deposited thereon. This film is optically transparent but electrically conductive. The indium tin oxide film is connected to electrical ground. A direct current (DC) bias 14 is applied to each BSM I/O pin 15 (only one shown) in a sequential order. The BSM I/O pin 15 is connected through the MCM substrate 11, through vias and layer metalization, to a corresponding TSM I/O net 16. The DC bias applied BSM I/O pin 15 causes a plasma discharge 17 in the gas between the substrate and the quartz plate 12. A current monitor 18 monitors the current flow due to the plasma discharge. In the alternative, a low frequency voltage can be used in place of the DC bias. The use of a low frequency bias will accomplish the same thing as the DC bias but additionally allow the use of a lock in amplifier if desired to improve the signal to noise ratio of the output measurement.

Figure 2:
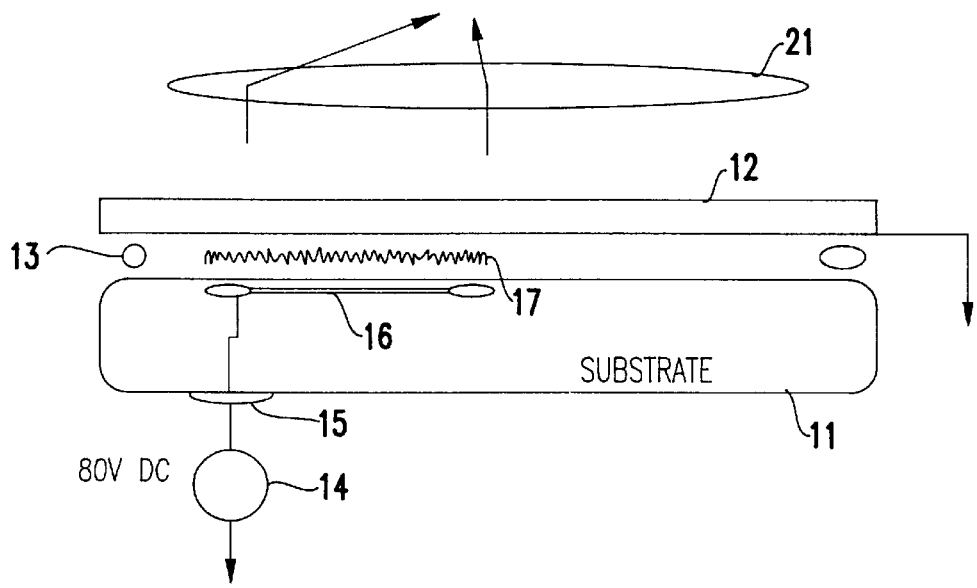
FIG. 2 is a functional block diagram showing the structure of an alternative embodiment of the invention.

In FIG. 2, the current monitor is replaced by an inexpensive lens 21 and photomultiplier tube 22. The photomultiplier tube 22 monitors the light flux produced as a result of the plasma discharge, this light flux being the optical analog of the current sensed in the embodiment shown in FIG. 1.

Figure 3:
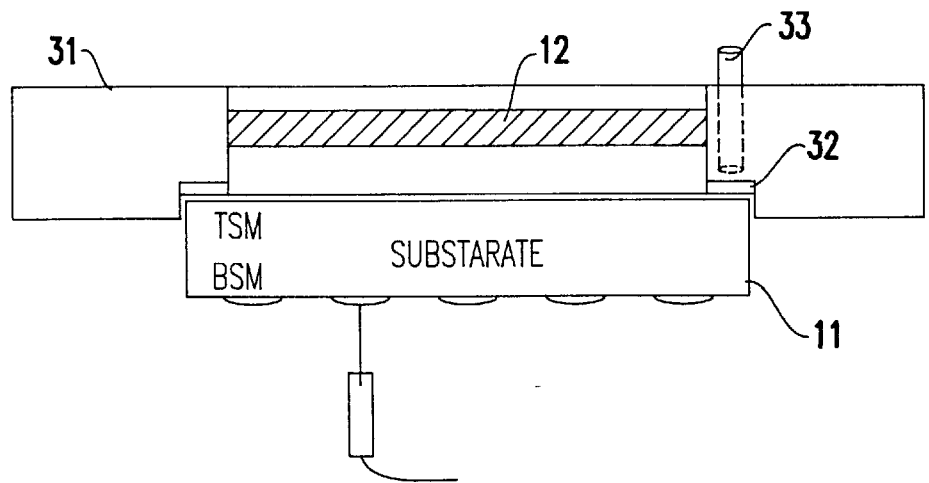
FIG. 3 is a side view in cross-section of one form of mechanical fixture that may be used with either of the embodiments of FIGS. 1 and 2.

FIG. 3 illustrates a mechanical fixture which can be used with either of the embodiments of FIGS. 1 or 2. The fixture comprises a plate 31 having an aperture formed therein to receive the quartz plate 12. The quartz plate 12 is sealed within the aperture to form a gas tight seal. On the bottom side of the plate 31 there is a rabbet formed about the periphery of the aperture to receive the substrate 11. The faces of the rabbet are covered with a gasket material 32 to form a gas tight seal with the substrate 11 under mechanical pressure. Two ports 33 (only one showing) communicate through the plate 31 with the space between the quartz plate 12 and the substrate 11. These ports are used to first of all evacuate air from the space between the quartz plate 12 and the substrate 11 and then to inject a luminescing gas, such as neon or argon, into the space which will be at a slight vacuum on the order of 0.1 to 0.5 atmospheres. After the test, the gas can then be evacuated, to be recycled for the next test, and air injected to break the vacuum and allow the substrate to be removed from the fixture. Once the substrate is mounted in the fixture and the luminescing gas injected in the space between the quartz plate 12 and the substrate 11, a robotic contact probe 34 is moved and contacts each BSM I/O pad in a predetermined sequence to apply the DC bias to the BSM I/O pads. Depending on which embodiment is being practiced (i.e., FIG. 1 or FIG. 2), a current monitor measures the current due to the plasma discharge or a photomultiplier tube generates a signal proportional to the light flux due to the plasma discharge.

Figure 4:
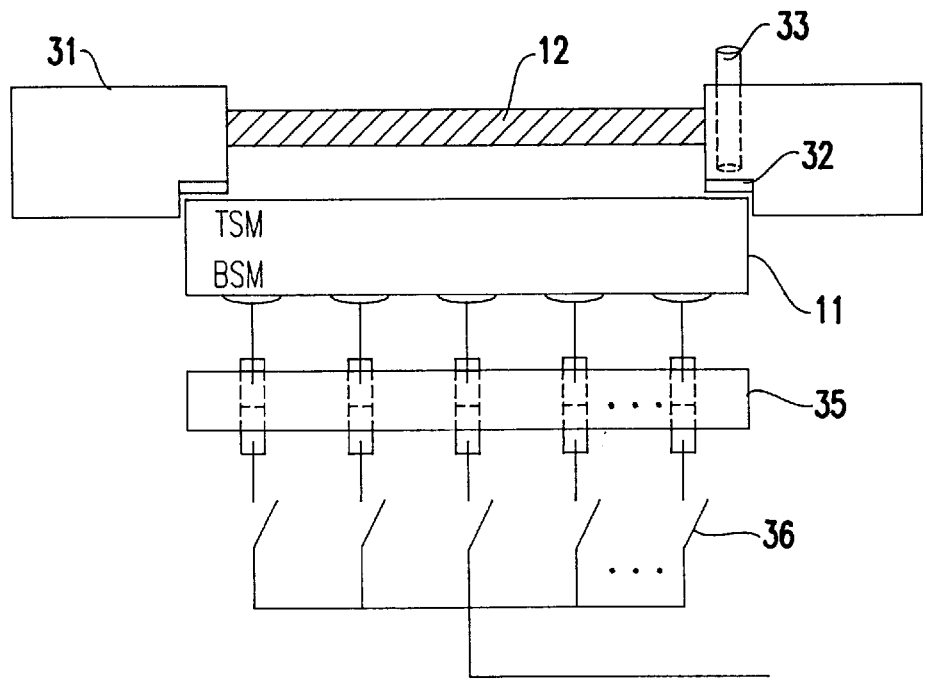
FIG. 4 is a side view in cross-section of another form of mechanical fixture that may be used with either of the embodiments of FIGS. 1 and 2.

An alternative fixture is shown in FIG. 4. This fixture is essentially the same as that of FIG. 3 except that the robotic contact probe 34 is replaced by a "pogo" contact fixture 35 having one pin for each BSM I/O pad. The pins of this fixture are brought into contact with the BSM I/O pads and then, through switching matrix 36, a DC bias (or low frequency AC bias) is applied to each of the BSM I/O pads, again according to a predetermined sequence.

Figure 5:
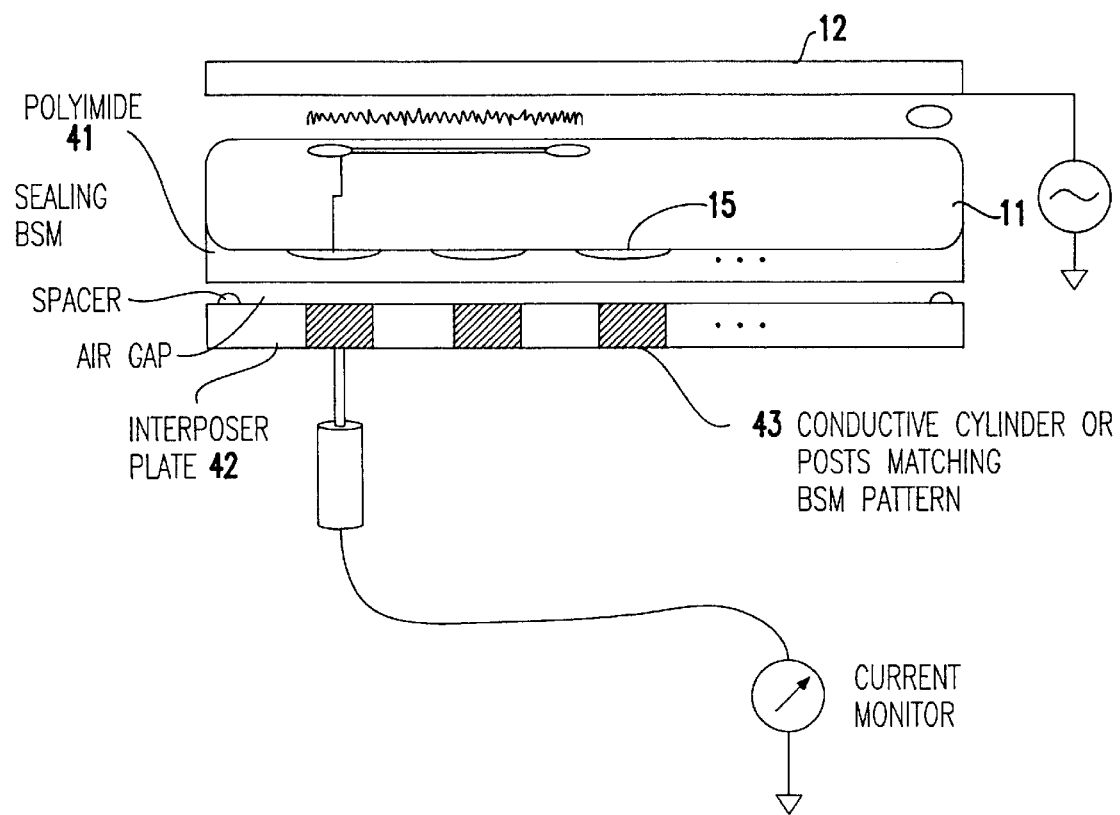
FIG. 5 is a side view in cross-section of a test fixture showing a high frequency signal capacitively coupled to BSM signal lines to test for opens and shorts where the BSM is sealed in polyimide.

FIG. 5 shows a high frequency implementation of the plasma test for opens and shorts using capacitive coupling to the BSM pads. This approach is used for those MCM processes which require that the BSM pads be sealed in polyimide 41 for many of the processing steps, thus making it impossible to directly ohmically contact each I/O or voltage plane pad. An interposer plate 42 is place parallel and beneath the BSM. The interposer plate 42 is itself insulating but contains a plurality if conductive cylinders or posts 43 under each BSM I/O pad. These conductive posts 43 have a radius which is the same or slightly less than the radius of the corresponding I/O pad 15. The interposer plate 42 is separated from the BSM by a spacer defining an air gap between the polyimide covered BSM and the interposer plate. The conductive posts 43 and BSM pads 15 form parallel plate capacitors. A test signal having a frequency of 1 to 20 MHz is used to capacitively test for the presence of shorts. This arrangement will test metalization lines for opens and shorts, but it will not test laser vias.

The next group of tests, shown in FIGS. 6 and 7, is a simplified procedure of the embodiment shown in FIG. 5. The approach taken avoids robotic probing and a big switching matrix, but it is only good for power layers, which are still almost half the layers in a typical MCM. The tests made with the fixtures shown in FIGS. 6 and 7 will detect a short but will not locate it.

Referring first to FIG. 6, the interposer plate 45 comprises a solid conducive sheet 46 with holes 47 in registry with BSM voltage or ground pads 15. Pogo pins or other ohmic probes 48 pass through the holes 47 to make ohmic contact with the pads 15. The conductive sheet 46 maximizes capacitive coupling to the BSM I/O pads while minimizing coupling to voltage plane pads.

As mentioned, this simplified test fixture will test for BSM I/O to voltage plane shorts or voltage plane to voltage plane shorts with one optical or current measurement. The test fixture will not, by itself, allow for location of detected shorts. However, it is possible, using a magnetic probe proximate the TSM, to detect the magnetic location of voltage plane to BSM I/O shorts.

Again, there is a difficulty in making the test if the BSM pads are sealed in a polyimide. A capacitively coupled interposer plate 51 as shown in FIG. 7 may be used in this case. The interposer plate 51 comprises a solid conducive sheet 52 with holes 53 in registry with BSM voltage or ground pads 15. As in the fixture of FIG. 5, a few special pads, which are not sealed, are set aside for direct ohmic resistive contact probing of each voltage plane. In the case of testing power mesh layers for BSM I/O voltage shorts, the plasma induced current will be much lower if no I/O is shorted to the very large area voltage plane so one measurement of the one induced current will detect the presence of any BSM I/O to voltage plane short of sufficiently low resistance. This test is performed with a test signal frequency in the range of 1 to 20 MHZ range to capacitively couple the plate 52 to the BSM pads.

While the test fixtures shown in FIGS. 6 and 7 do not provide a location of detected shorts, they can be further modified as shown in FIGS. 8 to 10 to provide an indication of location of detected shorts. FIG. 8 is similar to FIG. 6 where ohmic probing is possible and illustrates a method of visualizing the location of a voltage plane to voltage plane short using an AC glow plasma with a pulsed current through the short. The current through a short 55 once detected is pulsed at a low frequence (e.g., on the order of 5 Hz). Since the current through the short in the TSM will generally be in the horizontal plane and the moving charges are in vertical motion, the magnetic field will exert a force locally on the glow plasma 56 causing a blinking effect which can be visually inspected to localize the short and repair. Visual inspection is made through the indium tin oxide film on the quartz plate 12.

In the case where the BSM I/O pads are sealed with a polyimide film, the test fixture of FIG. 9, corresponding to the test fixture shown in FIG. 7, is used. Again a pulsed AC current is applied to the detected short to produce a blinking plasma which may be located by visual inspection.

As a further modification of the method illustrated in FIG. 9, the pulsed current is modulated by a high frequency signal as shown in FIG. 10 to provide capacitive coupling to the BSM I/O pads. Again, ohmic contact is made to at least one of each voltage plane pad not sealed in polyimide.

While the invention has been described in terms of preferred embodiments, those skilled in the art will recognize that the invention can be practiced with modification within the spirit and scope of the appended claims.

Having thus described my invention, what I claim as new and desire to secure by letters patent is as follows:

1. A contactless test apparatus for testing for opens and shorts in a module under test containing electrical circuits comprising:

a fixture frame having an aperture with a rabbeted edge to receive a module to be tested;

a gasketed seal within the rabbeted edge to form a gas tight seal with the module to be tested;

a quartz plate sealed within the aperture and spaced from a top surface of the module to be tested when inserted into the fixture, the quartz plate being plated with a thin conductive coating to form a ground plane;

means for filling a gap between the module to be tested and the quartz plate with a gas;

biasing means for biasing a circuit in the module to be tested to cause a plasma discharge in the gas; and recording means for recording an effect of an open or short in said circuit on a glow pattern of the plasma discharge.

2. The contactless test apparatus as recited in claim 1 wherein the gas is selected from the group consisting of neon and argon.

3. The contactless test apparatus as recited in claim 1 wherein the thin conductive coating on the quartz plate is indium tin oxide.

4. The contactless test apparatus as recited in claim 1 wherein the effect of the glow pattern is a current flow and the recording means comprises a current monitor for monitoring the current flow through the circuit.

5. The contactless test apparatus as recited in claim 1 wherein the effect of the glow pattern is a light flux and the recording means comprises a means for measuring the light flux.

6. The contactless test apparatus as recited in claim 1 wherein the biasing means includes a robotic probe for contacting pads on a bottom surface of metallurgy of the module in a predetermined sequence.

7. The contactless test apparatus as recited in claim 1 wherein the biasing means comprises:

a plurality of probes for contacting pads on a bottom surface of metallurgy of the module; and switching means for connecting each probe of the plurality of probes to a source of bias current in a predetermined sequence.

8. The contactless test apparatus as recited in claim 1 wherein the biasing means comprises:

an interposer plate having cylindrical conductive posts in registry with pads on a bottom surface metallurgy of the module; and a source of high frequency test signal selectively coupled to said conductive posts to capacitively couple to the pads in a predetermined sequence.

9. The contactless test apparatus as recited in claim 1 wherein the biasing means makes ohmic contact with at least selected voltage plane pads on a bottom surface metallurgy of the module.

10. The contactless test apparatus as recited in claim 1 further comprising means for pulsing a bias current to a detected short to cause the glow pattern of plasma discharge to blink thereby allowing visual inspection of the glow pattern to determine a location of the short.

* * * * *